(12) United States Patent
Kang et al.

(10) Patent No.: US 7,305,607 B2
(45) Date of Patent: Dec. 4, 2007

(54) NONVOLATILE FERROELECTRIC MEMORY DEVICE INCLUDING FAILED CELL CORRECTING CIRCUIT

(75) Inventors: Hee Bok Kang, Daejeongwangyeok-si (KR); Jin Hong Ahn, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 162 days.

(21) Appl. No.: 11/321,869

(22) Filed: Dec. 30, 2005

(65) Prior Publication Data
US 2006/0242539 A1  Oct. 26, 2006

(30) Foreign Application Priority Data
Apr. 21, 2005  (KR)  ............... 10-2005-0033157

(51) Int. Cl.
*G11C 29/00* (2006.01)
(52) U.S. Cl. .................. 714/764; 714/766
(58) Field of Classification Search ........ 714/773, 714/711, 763, 764, 766; 365/200, 145
See application file for complete search history.

(56) References Cited

U.S. PATENT DOCUMENTS

| | | | |
|---|---|---|---|
| 4,456,980 A | | 6/1984 | Yamada et al. |
| 4,688,219 A | | 8/1987 | Takemae ................ 371/10 |
| 4,706,249 A | * | 11/1987 | Nakagawa et al. ......... 714/773 |
| 4,726,021 A | * | 2/1988 | Horiguchi et al. ......... 714/773 |
| 4,747,080 A | | 5/1988 | Yamada |
| 4,768,193 A | * | 8/1988 | Takemae ................ 714/711 |
| 5,134,616 A | * | 7/1992 | Barth et al. ............. 714/711 |
| 5,592,499 A | | 1/1997 | Tanoi |
| 6,185,136 B1 | * | 2/2001 | Shirley ................. 365/200 |
| 6,215,692 B1 | * | 4/2001 | Kang ................... 365/145 |
| 6,678,860 B1 | | 1/2004 | Lee |
| 6,906,943 B2 | * | 6/2005 | Kang ................... 365/145 |
| 7,069,493 B2 | * | 6/2006 | Takahashi et al. ......... 714/763 |
| 2002/0144210 A1 | | 10/2002 | Borkenhagen et al. |
| 2004/0160853 A1 | | 8/2004 | Tanaka |
| 2005/0005230 A1 | | 1/2005 | Koga et al. |
| 2005/0172177 A1 | | 8/2005 | Oikawa |

FOREIGN PATENT DOCUMENTS

| | | |
|---|---|---|
| JP | 61-265799 A | 11/1986 |
| JP | 02-166700 | 6/1990 |
| JP | 10-326497 | 12/1998 |
| JP | 2004-246754 | 9/2004 |
| JP | 2005-085357 | 3/2005 |
| KR | 10199900010772 A | 7/1990 |
| KR | 100266748 B1 | 6/2000 |

* cited by examiner

*Primary Examiner*—David Ton
(74) *Attorney, Agent, or Firm*—Townsend & Townsend & Crew LLP (57) ABSTRACT

A nonvolatile ferroelectric memory device including a failed cell correcting circuit which effectively processes randomly distributed cell data. The nonvolatile ferroelectric memory device checks horizontal parity of a main memory cell array and stores the parity in a horizontal parity check cell array, and checks vertical parity of a main memory cell array and stores the parity in the vertical parity check cell array. Then, code data stored in the horizontal parity check cell array and the vertical parity check cell array are compared to sensing data of the main memory cell to correct an error datum. As a result, a 1 bit failure randomly generated within a predetermined column is corrected.

14 Claims, 11 Drawing Sheets

NONVOLATILE FERROELECTRIC MEMORY DEVICE INCLUDING FAILED CELL CORRECTING CIRCUIT

BACKGROUND OF THE INVENTION

1. Field of the Invention

The present invention generally relates to a nonvolatile ferroelectric memory device including a failed cell correcting circuit, and more specifically, to a technology for effectively processing randomly distributed cell data as well as failed cell correcting circuits when a 1 bit failure is randomly generated in a predetermined column of a nonvolatile ferroelectric memory device.

2. Description of the Related Art

Generally, a ferroelectric random access memory (hereinafter, referred to as 'FeRAM') has attracted considerable attention as a next generation memory device because it has a data processing speed as fast as that of a Dynamic Random Access Memory (hereinafter, referred to as 'DRAM') and it conserves data even after the power is turned off.

The FeRAM structures include capacitors made of a ferroelectric substance which utilize the high residual polarization characteristic of the ferroelectric substance to ensure that data is not deleted even after an electric field is eliminated.

Further technical descriptions of the above FeRAM are disclosed in the U.S. Pat. No. 6,775,172 by the inventor of the present invention. Therefore, the basic structure and the operation on the FeRAM are not described herein When the cell data are randomly distributed, it is difficult to repair a failed cell with a repair circuit and effectively utilize the cell data.

SUMMARY OF THE INVENTION

Various embodiments of the present invention are directed at checking horizontal parity and vertical parity of a main memory cell array to be stored at horizontal/vertical parity check cell arrays, and at comparing code data stored in the horizontal/vertical parity check cell array with sensing data of the main memory cell array to correct an error code having a failure, thereby normally correcting a failure generated randomly in a predetermined column.

According to one embodiment of the present invention, a nonvolatile ferroelectric memory device comprises a main memory cell array including a plurality of nonvolatile ferroelectric memory cells which are configured as a plurality of main cell array groups, a horizontal parity check cell array adapted and configured to check and store horizontal parity of the main cell array group in a plurality of horizontal parity arrays, a vertical parity check cell array adapted and configured to check and store vertical parity of the main cell array group in a plurality of vertical parity arrays, and an error correcting code processing unit adapted and configured to compare data stored in the main memory cell array, code data stored in the horizontal parity check cell array and code data stored in the vertical parity check cell array, and correct error data generated from a corresponding column into normal data.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
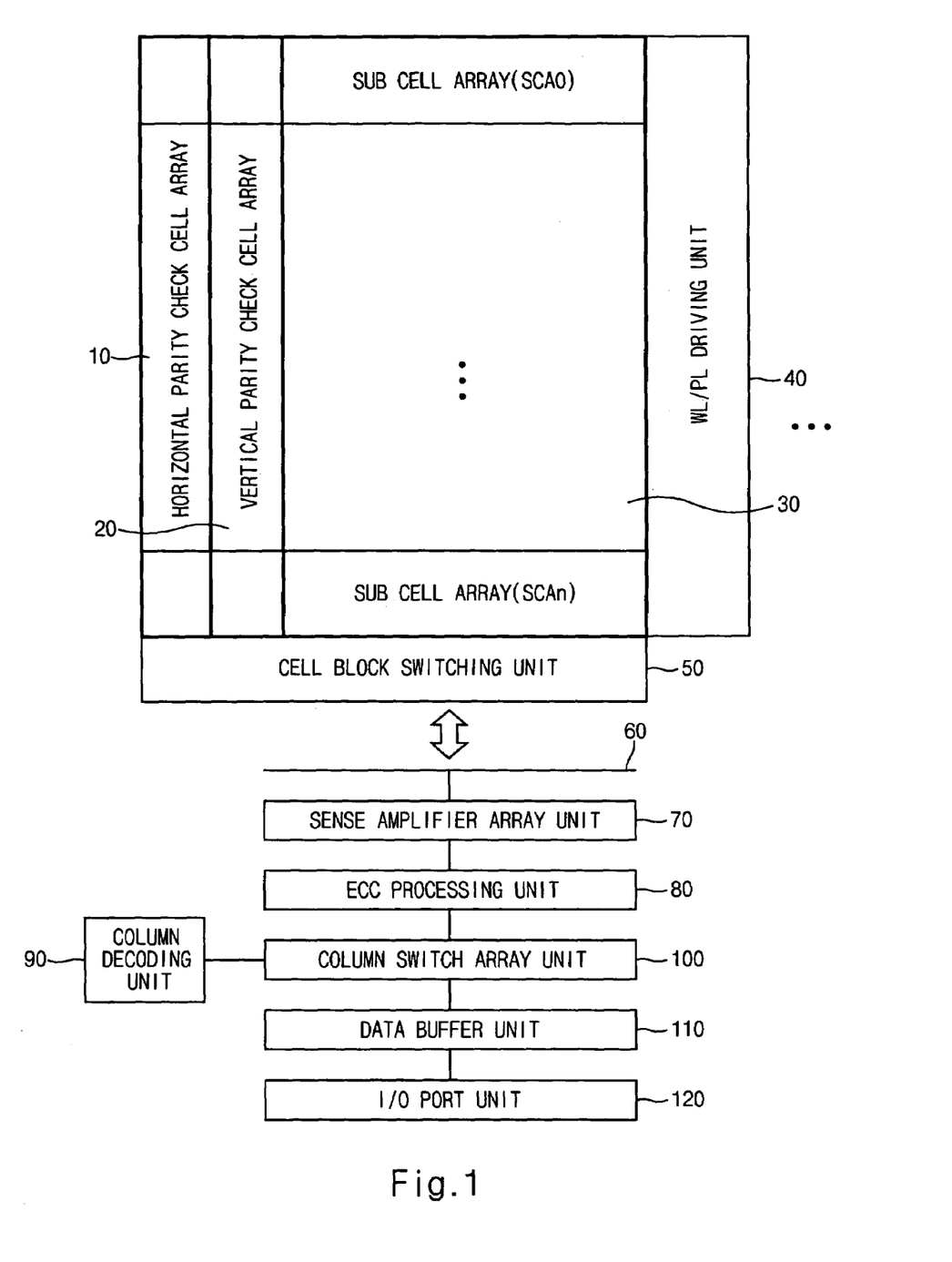
FIG. 1 is a diagram illustrating a nonvolatile ferroelectric memory device including a failed cell correcting circuit according to an embodiment of the present invention.

FIG. 1 is a diagram illustrating a nonvolatile ferroelectric memory device including a failed cell correcting circuit according to an embodiment of the present invention.

In this embodiment, the nonvolatile ferroelectric memory device comprise a horizontal parity check cell array 10, a vertical parity check cell array 20, a main memory cell array 30, a word line/plate line driving unit 40, a cell block switching unit 50, a data bus 60, a sense amplifier array unit 70, an error correction code (hereinafter, referred to as "ECC") processing unit 80, a column decoding unit 90, a column switch array 100, a data buffer unit 110 and an I/O port unit 120.

Each of the horizontal parity check cell array 10, the vertical parity check cell array 20 and the main memory cell array 30 comprises a plurality of sub cell arrays SCA0~SCAn each having a hierarchical bit line structure.

Bit lines in the horizontal parity check cell array 10, the vertical parity check cell array 20 and the main memory cell array 30 are connected to the common data bus 60 through the cell block switching unit 50. The sense amplifier array unit 70 amplifies data applied from the cell block switching unit 50 through the data bus 60 to output the data to the ECC processing unit 80.

The column switch array unit 100 outputs selection data of the ECC processing unit 80 to the data buffer unit 110 in response to a decoding signal of the column decoding unit 90. The data buffer unit 110 buffers data transmitted through the column switch array unit 100 to output the data to the I/O port unit 120.

The above-described embodiment checks horizontal parity of the main memory cell array 30 and stores the horizontal parity in the horizontal parity check cell array 10, and checks vertical parity of the main memory cell 30 and stores the vertical parity in the vertical parity check cell array 20.

In other words, the horizontal parity check cell array 10 checks how many cell blocks have an error bit in the main memory cell array 30 and stores data indicating the presence of an error bit in the horizontal parity check cell array 10. The vertical parity check cell array 20 checks in which column of one cell block an error bit is generated and stores data indicating the presence of an error bit in the vertical parity check cell array 20.

The ECC processing unit 80 compares code data stored in the horizontal parity check cell array 10 and the vertical parity check cell array 20 to judge that an error bit is generated when the two compared data are different, and if an error bit is generated, the ECC processing unit 80 corrects the error data turning it into normal data.

Figure 2:
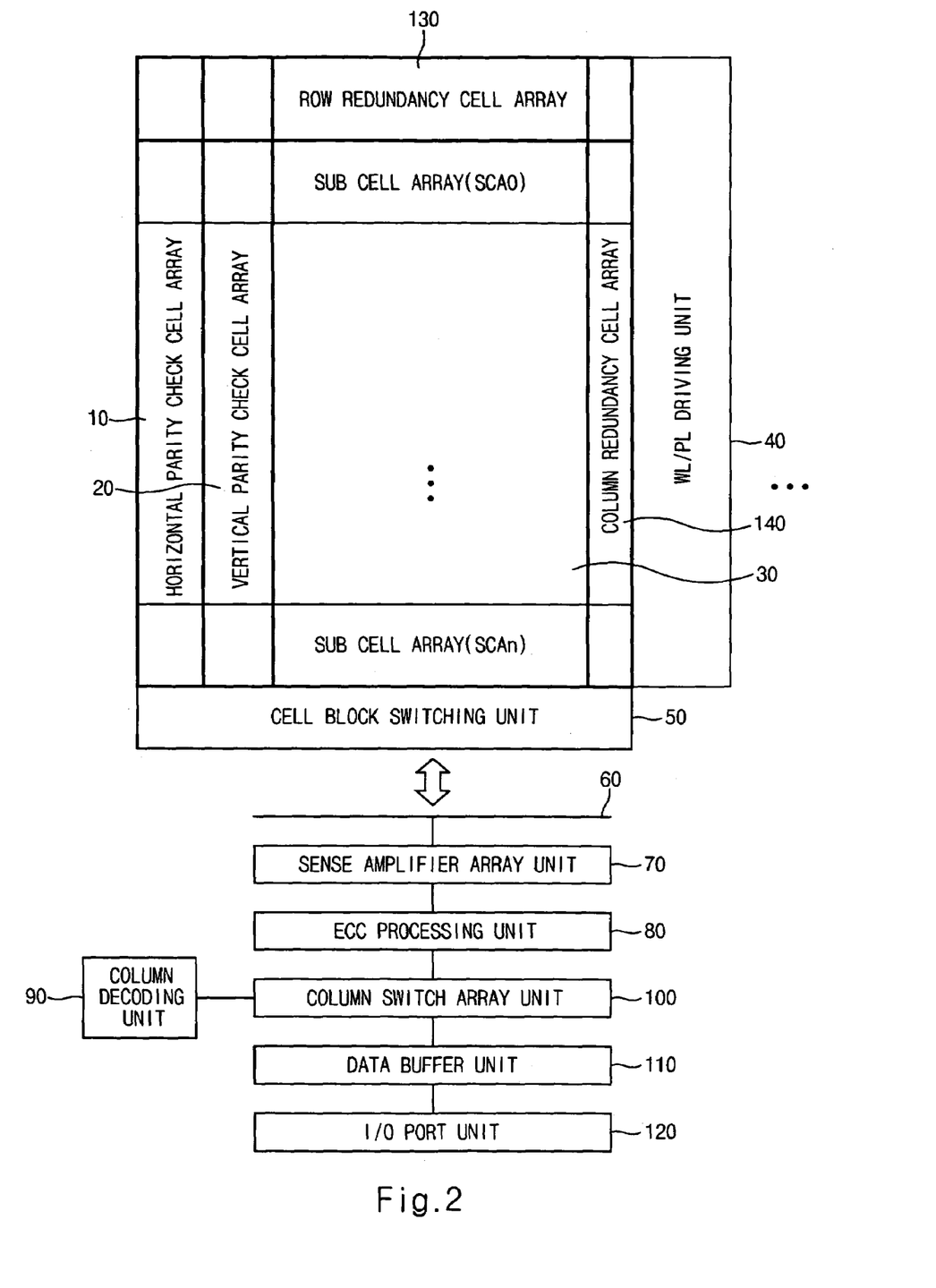
FIG. 2 is a diagram illustrating a nonvolatile ferroelectric memory device including a failed cell correcting circuit according to another embodiment of the present invention.

FIG. 2 is a diagram illustrating a nonvolatile ferroelectric memory device including a failed cell correcting circuit according to another embodiment of the present invention.

In comparison with the embodiment of FIG. 1, the embodiment of FIG. 2 further comprises a row redundancy cell array 130 and a column redundancy cell array 140 for repairing two or more failed cells in the main memory cell array 30.

The row redundancy cell array 130 and the column redundancy cell array 140 comprise a redundancy sub cell array RSCA, respectively. The redundancy sub cell array RSCA is substantially similar to components of the sub cell array SCA0~SCAn of the main memory cell array 30.

Figure 3:
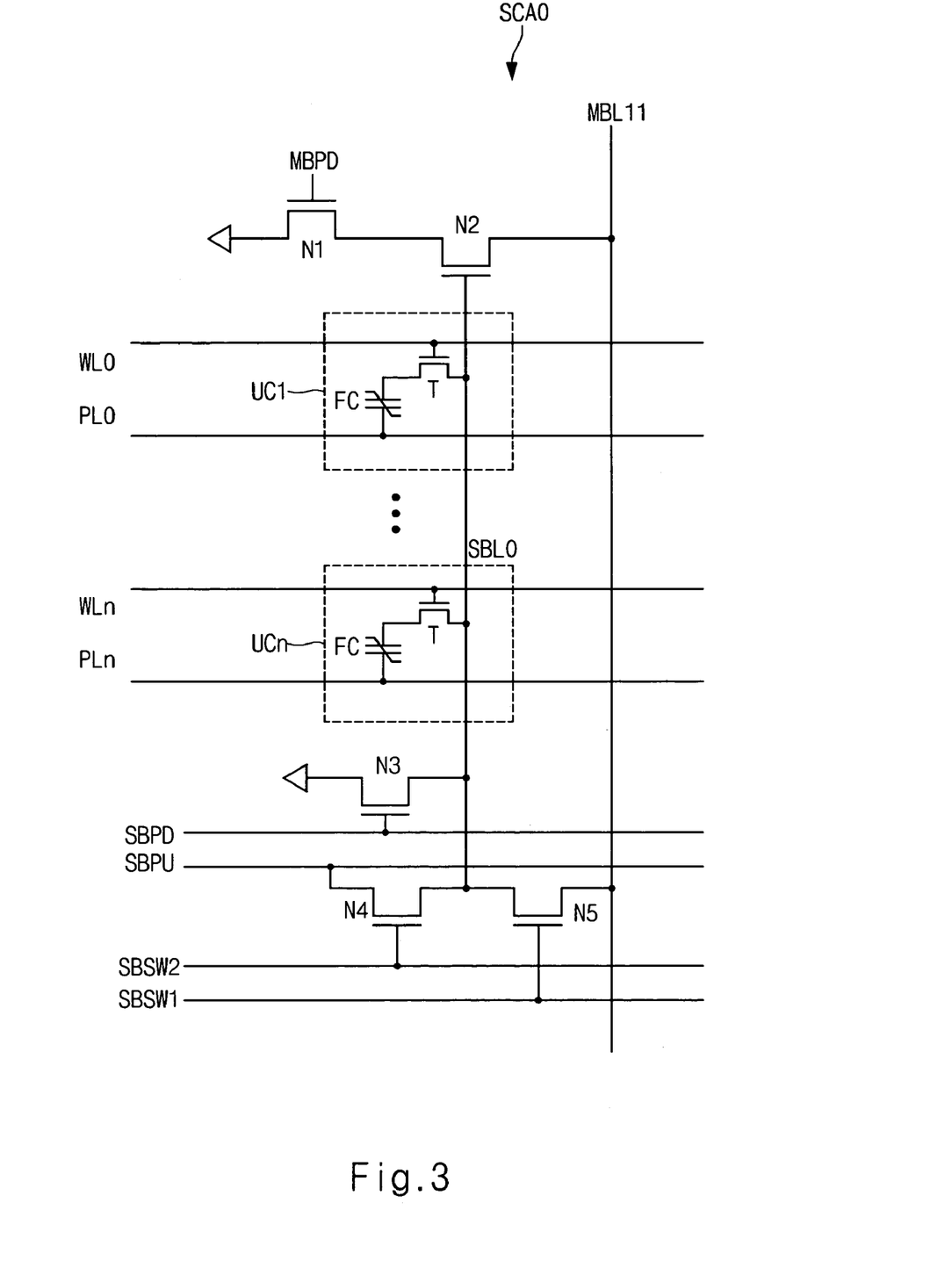
FIG. 3 is a circuit diagram illustrating a sub cell array of FIG. 1.

FIG. 3 is a circuit diagram illustrating the sub cell array SCA0 of FIG. 1 having a hierarchical bit line structure.

The sub cell array SCA0 has a hierarchical bit line structure comprising a plurality of main bit lines MBL11 and a plurality of sub bit lines SBL0. Each main bit line MBL11 of the sub cell array SCA0 is selectively connected to one of the plurality of sub bit lines SBL0. That is, when one of a plurality of sub bit line selecting signals SBSW1 is activated, a NMOS transistor N5 is turned on to activated one of the sub bit lines SBL0.

A plurality of unit cells UC0~UCn are connected to one sub bit line SBL0. Each of the plurality of unit cells UC0~UCn comprises one switching transistor T and one nonvolatile ferroelectric capacitor FC. The switching transistor T which is connected between the sub bit line SBL0 and the nonvolatile ferroelectric capacitor FC performs a switching operation depending on a voltage applied to a word line WL0 to regulate a sensing voltage of the main bit line MBL11.

The sub bit line SBL0 is pulled down to a ground level when the NMOS transistor N3 is turned on by a sub bit line pull-down signal SBPD. A sub bit line pull-up signal SBPU is to control a power source supplied to the sub bit line SBL0. That is, a high voltage higher than a power voltage VCC is generated at a low voltage, and is supplied to the sub bit line SBL0.

A sub bit line selecting signal SBSW2 controls the connection between a sub bit line pull-up signal SBPU terminal and the sub bit line SBL depending on the switching operation of a NMOS transistor N4.

A NMOS transistor N2, connected between a NMOS transistor N1 and the main bit line MBL, has a gate to be connected to the sub bit line SBL. The NMOS transistor N1, connected between a ground voltage terminal and the NMOS transistor N2, has a gate to receive a main bit line pull-down signal MBPD, thereby regulating the sensing voltage of the main bit line MBL11.

Figure 4:
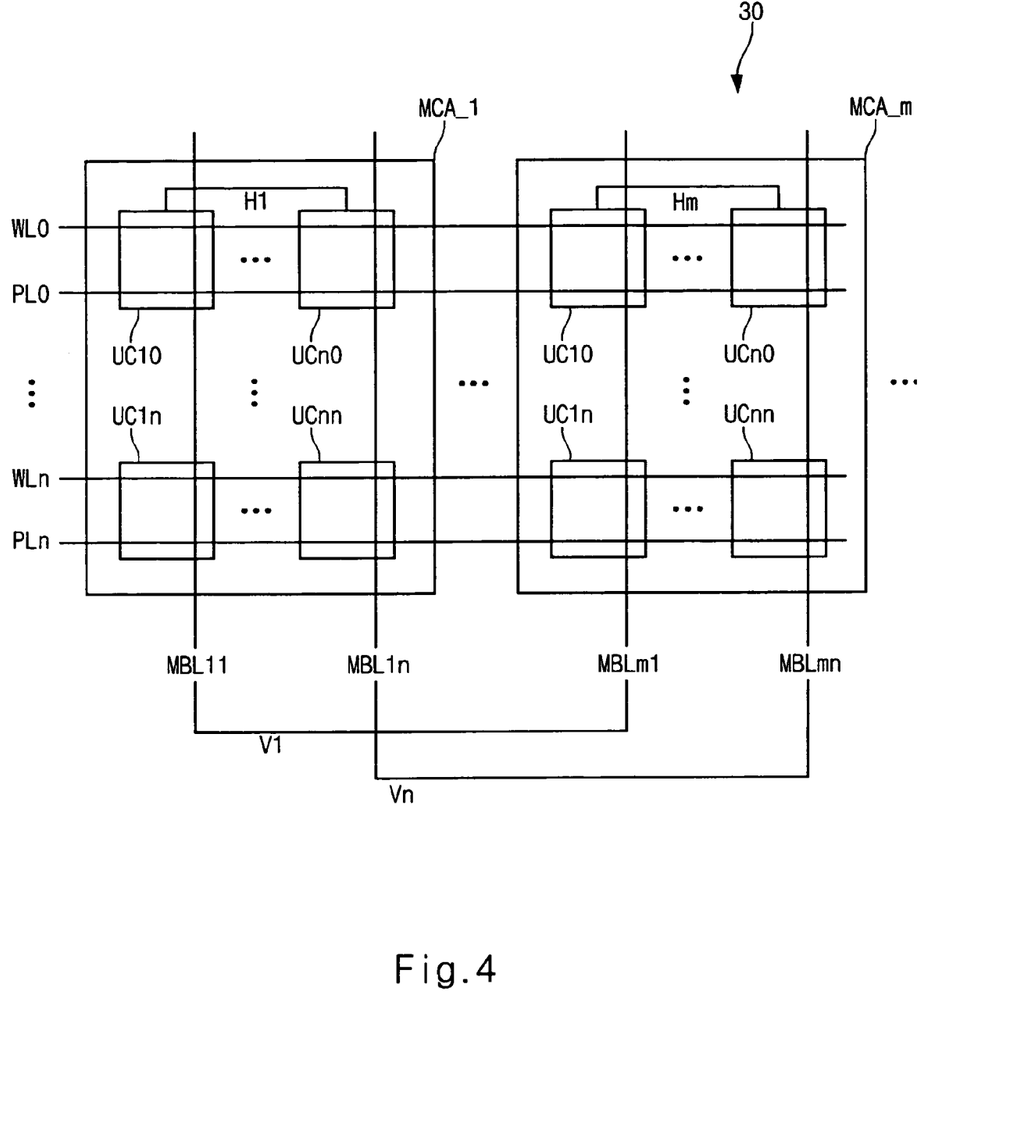
FIG. 4 is a circuit diagram illustrating a main memory cell array of FIG. 1.

FIG. 4 is a circuit diagram illustrating the main memory cell array 30 of FIG. 1.

The main memory cell array 30 comprises a plurality of main cell arrays MCA_1~MCA_m. The main cell array MCA_1 includes a plurality of unit cells UC10~UC1$n$. Columns of the main bit lines MBL11~MBL1$n$ are configured as one horizontal parity array group H1.

The number of horizontal parity array groups is m, and the number of internal vertical parity array group V1~Vn in one horizontal parity array group H1 is n. As a result, the number of whole main bit lines is m×n.

The vertical parity array group V1~Vn are sequentially configured as the same order in each of the main cell arrays MCA_~MCA_m. That is, the first main bit line MBL11 of the main cell array MCA_1 is with the first main bit line MBLm_1 of the main cell array MCA_m to form one vertical parity array group V1. Then, the final main bit line MBL1$n$ of the main cell array MCA_1 is configured as the final main bit line MBLmn of the main cell array MCA_m to form one vertical parity array group Vn.

Figure 5:
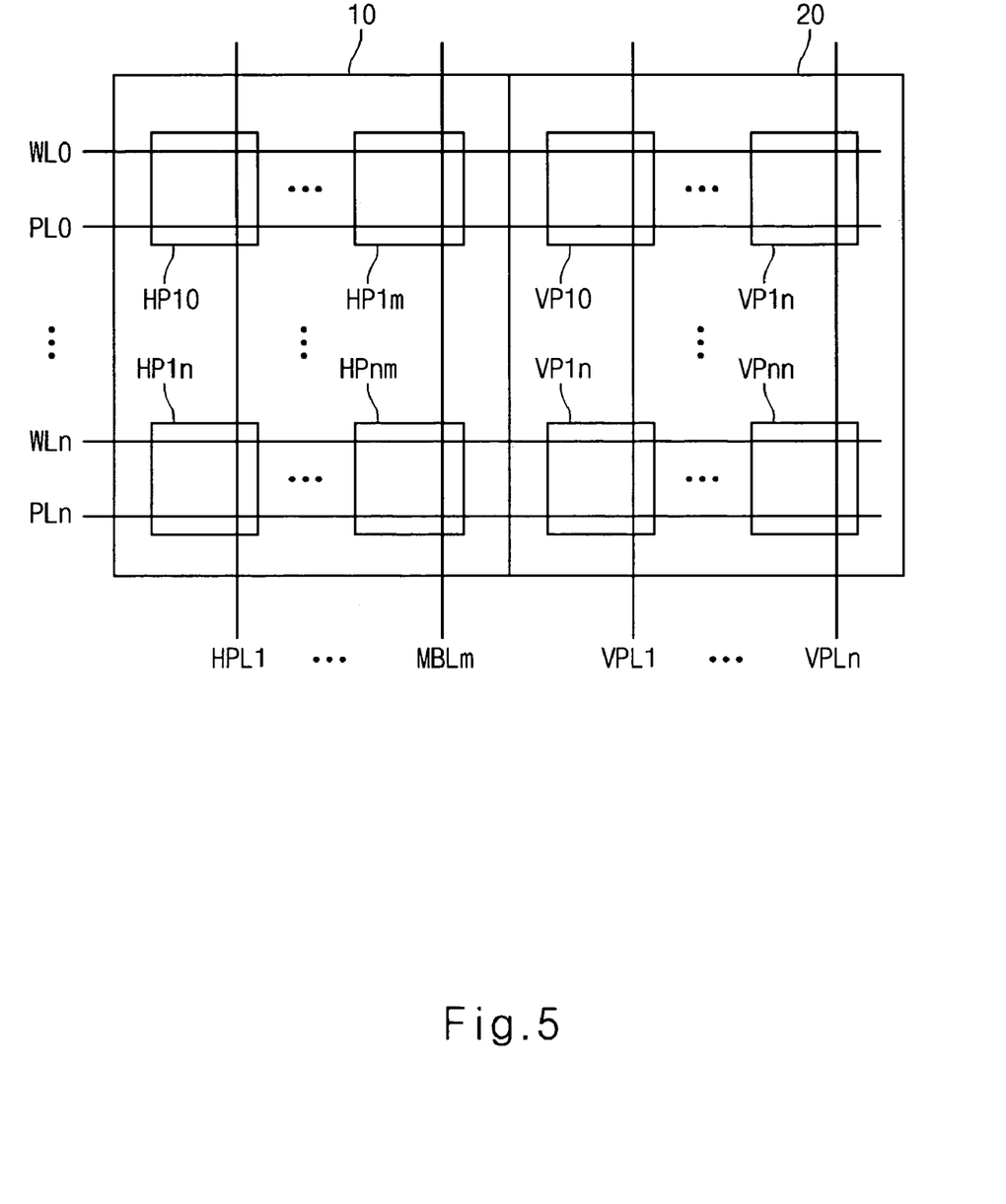
FIG. 5 is a diagram illustrating a horizontal parity check cell array and a vertical parity check cell array of FIG. 1.

FIG. 5 is a diagram illustrating the horizontal parity check cell array 10 and the vertical parity check cell array 20 of FIG. 1.

The horizontal parity check cell array 10 comprises a plurality of horizontal parity cells HP10~HPnm, and the vertical parity check cell array 20 comprises a plurality of vertical parity cells VP10~VPnn.

The main cell arrays MCA_1~MCA_m are configured as m horizontal parity array groups H1~Hm and n vertical parity arrays V1~Vn, so that each parity check data is stored in the horizontal parity check cell array 10 and the vertical parity check cell array 20.

The parity check data of the first horizontal parity array group Hi in the main memory cell array 30 are stored in the first horizontal parity cells HP10~HP1$m$ of the horizontal parity check cell array 10. The parity check data of the final horizontal parity array Hm are stored in the mth horizontal parity cells HP1m~HPnm of the horizontal parity check cell array 10.

The parity check data of the first vertical parity array group V1 in the main memory cell array 30 are stored in the first vertical parity cells VP10~VP1$n$ of the vertical parity check cell array 20. The parity check data of the final vertical parity array group Vn are stored in the nth vertical parity cells VP1$n$~VPnn of the vertical parity check cell array 20.

The horizontal check data applied from the horizontal parity arrays HP1~HPm are outputted to the m horizontal parity lines HPL_1~HPL_m through the cell block switching unit 50. The vertical check data applied from the vertical parity arrays VP1~VPn are outputted to the n vertical parity lines VPL_1~VPL_n through the cell block switching unit 50 shown in FIGS. 1 and 2.

Figure 6:
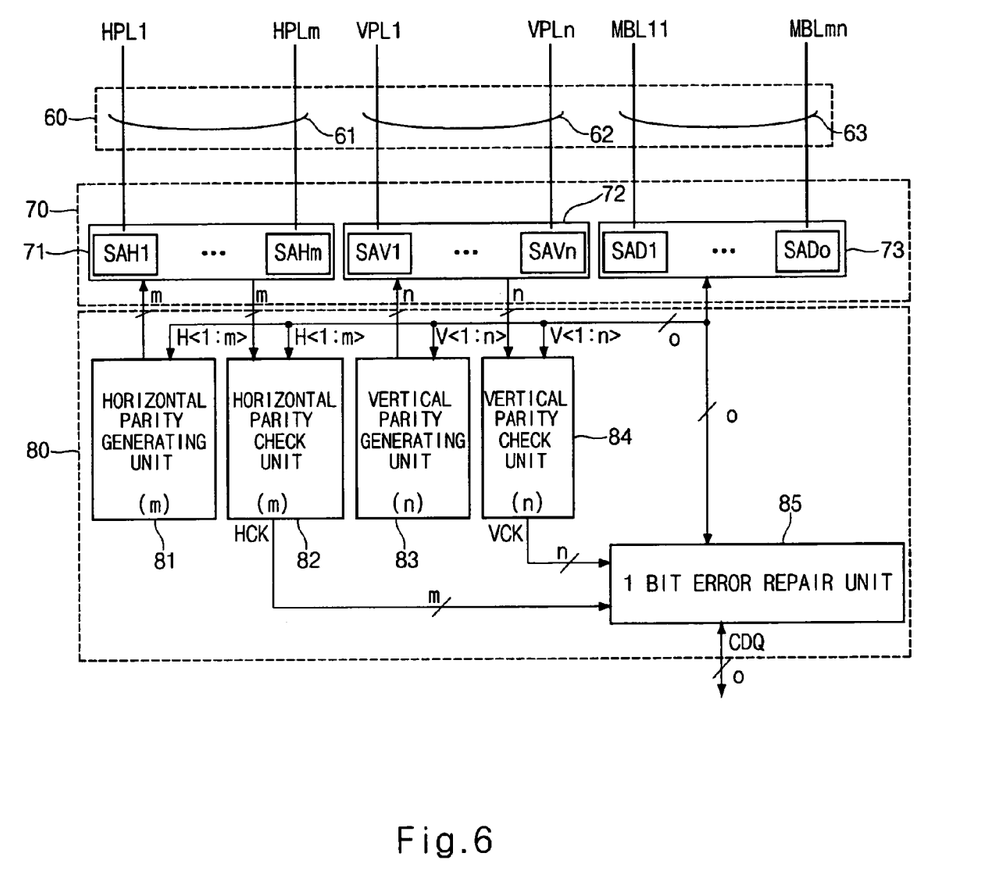
FIG. 6 is a diagram illustrating an ECC processing unit of FIG. 1.

FIG. 6 is a diagram illustrating the data bus 60, the sense amplifier array unit 70 and the ECC processing unit 80 of FIG. 1.

The data bus 60 comprises a horizontal parity bus 61, a vertical parity bus 62 and a memory data bus 63.

The horizontal parity bus 61 includes horizontal parity lines HPL1~HPLm. The vertical parity bus 62 includes vertical parity lines VPL1~VPLn. The memory data bus 63 includes main bit lines MBL11~MBLmn of the main memory cell array 30.

The sense amplifier array unit 70 comprises a first sense amplifier unit 71, a second sense amplifier unit 72 and a third sense amplifier unit 73.

The first sense amplifier unit 71 which includes m sense amplifiers SAH1~SAHm amplifies the horizontal check data applied from the horizontal parity lines HPL1~HPLm of the horizontal parity bus 61 to output the data to the horizontal parity check unit 82. The first sense amplifier unit 71 outputs the parity data applied from the horizontal parity generating unit 81 to the horizontal parity lines HPL_1~HPL_m of the horizontal parity bus 61.

The second sense amplifier unit 72 which comprises n sense amplifiers SAV1~SAVn amplifies the vertical check data applied from the vertical parity line VPL1~VPLn of the vertical parity bus 62 to output the data to the vertical parity check unit 84. The second sense amplifier unit 72 outputs the parity check data applied from the vertical parity generating unit 83 to the vertical parity lines VPL1~VPLn of the vertical parity bus 62.

The third sense amplifier unit 73 comprises o(m×n) of sense amplifiers SAD1~SADo. The third sense amplifier unit 73 amplifies data applied from the main bit lines MBL11~MBLmn to output the data to the horizontal parity generating unit 81, the vertical parity check unit 82, the vertical parity generating unit 83, the vertical parity check unit 84 and a 1 bit error correcting unit 85.

The ECC processing unit 80 comprises the horizontal parity generating unit 81, the horizontal parity check unit 82, the vertical parity generating unit 83, the vertical parity check unit 84 and the 1 bit error correcting unit 85.

The horizontal parity generating unit 81 generates m horizontal parity data in response to output data of the third sense amplifier unit 73 to output the data to the first sense amplifier unit 71. The horizontal parity generating unit 81 generates the horizontal parity data to check the horizontal parity of data stored in the main memory cell array 30, and then writes the data in the horizontal parity check cell array 10.

The m sense amplifiers SAH1~SAHm of the first sense amplifier unit 71 are connected to the horizontal parity check unit 82. That is, the horizontal parity check unit 82 receives m output signals of the first sense amplifier unit 71 and m amplification data of the third sense amplifier unit 73 to check the horizontal parity, and outputs m horizontal parity check signals HCK to the 1 bit error correcting unit 85.

The vertical parity generating unit 83 generates n vertical parity data in response to output data of the third sense amplifier 73 to output the data to the second sense amplifier unit 72. The vertical parity generating unit 83 generates vertical parity data to check the vertical parity of data stored in the main memory cell array 30, and writes the parity data in the vertical parity check cell array 20.

The n sense amplifiers SAV1~SAVn of the second sense amplifier unit 72 are connected to the vertical parity check unit 84. That is, the vertical parity check unit 84 receives n output signals from the second sense amplifier unit 72 and m amplification data outputted from the third sense amplifier unit 73 to check the vertical parity, and outputs n vertical parity check signals VCK to the 1 bit error correcting unit 85.

The 1 bit error correcting unit 85 corrects a 1 bit error in response to m horizontal parity check signals HCK, n vertical parity check signals VCK and o data outputted from the third sense amplifier unit 73 to output an error correcting signal CDQ. Also, the 1 bit error correcting unit 85 outputs o input data applied from the column switching array unit 100 to write data in the main memory cell array 30 to output the data to the third sense amplifier unit 73.

The sense amplifier array unit 70 amplifies the sensed data and also serves as a write driver for storing write data in the memory cells.

Figure 7:
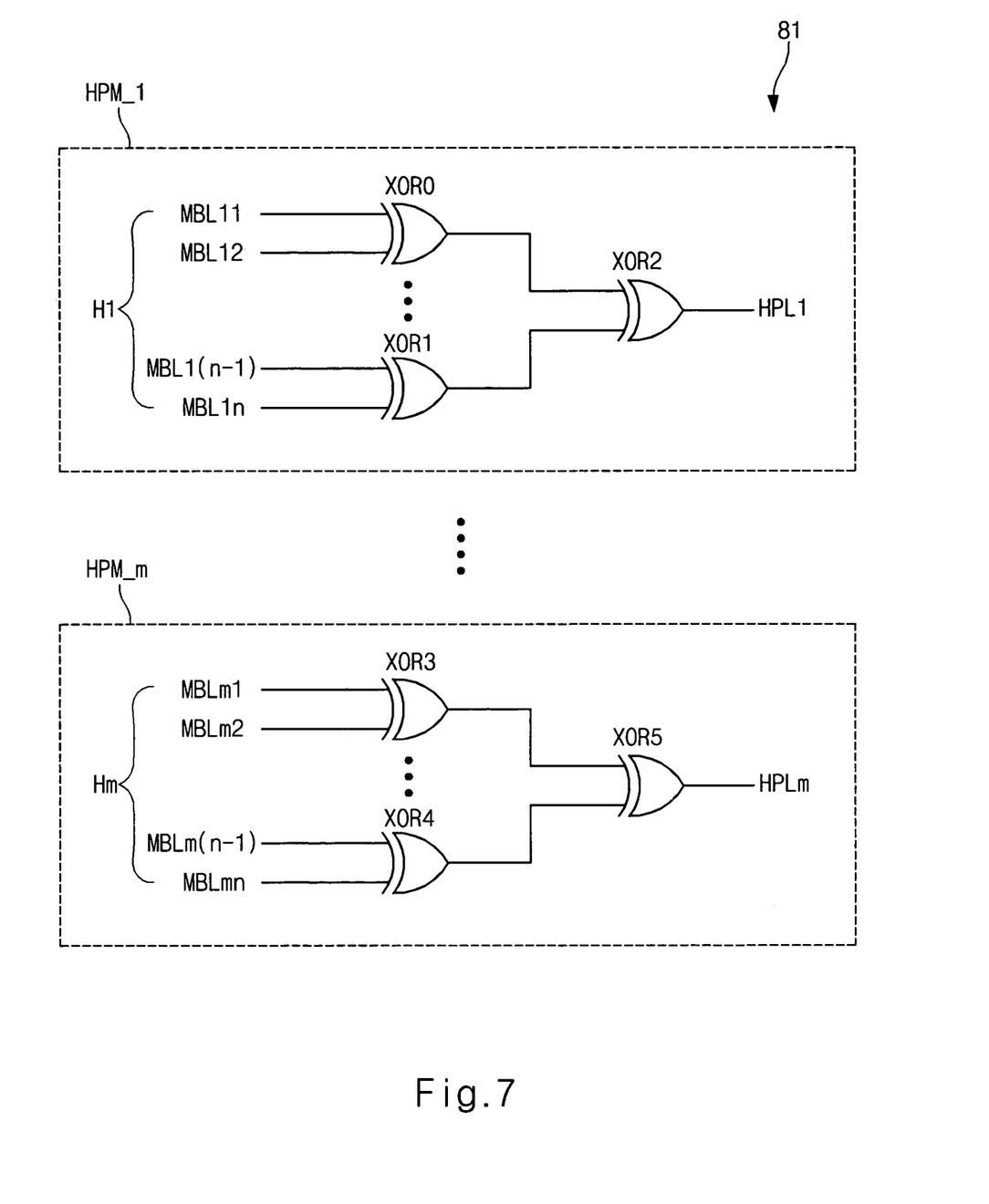
FIG. 7 is a circuit diagram illustrating a horizontal parity generating unit of FIG. 6.

FIG. 7 is a circuit diagram illustrating the horizontal parity generating unit 81 of FIG. 6.

The horizontal parity generating unit 81 comprises m horizontal parity group units HPM_1~HPM_m. The m horizontal parity group units HPM_1~HPM_m are connected one by one to a respective part m of the o sense amplifiers SAD1~SADo. Each of the horizontal parity group units HPM_1~HPM_m of the horizontal parity generating unit 81 performs an exclusive OR operation on the respective m horizontal parity array groups H1~Hn to output m parity generating signals to the respective horizontal parity lines HPL1~HPLn.

The first horizontal parity group unit HPM_1 comprises a plurality of exclusive OR gates XOR0~XOR2. In the same way, the mth horizontal parity group unit HPM_m comprises a plurality of exclusive OR gates XOR3~XOR5.

In other words, the first horizontal parity group unit HPM_1 performs an exclusive OR operation on the n horizontal parity array groups H1(MBL11~MBL1n) to output the parity data of the main bit lines MBL11~MBL1n to the horizontal parity line HPL_1. The final horizontal parity group unit HPM_m performs an exclusive OR operation on the n horizontal parity array groups Hn(MBLm1~MBLmn (to output the parity data of the main bit lines MBL1n~MBLmn to the horizontal parity line HPL_m.

Each of the m horizontal parity group units HPM_1~HPMm checks whether the number of "1" in the output signals from the horizontal parity array group H1~Hm is odd or even. "1" is outputted to each one of the horizontal parity lines HPL_1~HPL_m in which the number of "1" in the line is odd, and "0" is outputted to each one of the horizontal parity lines HPL_1~HPL_m in which the number of "1" in the line is even.

Figure 8:
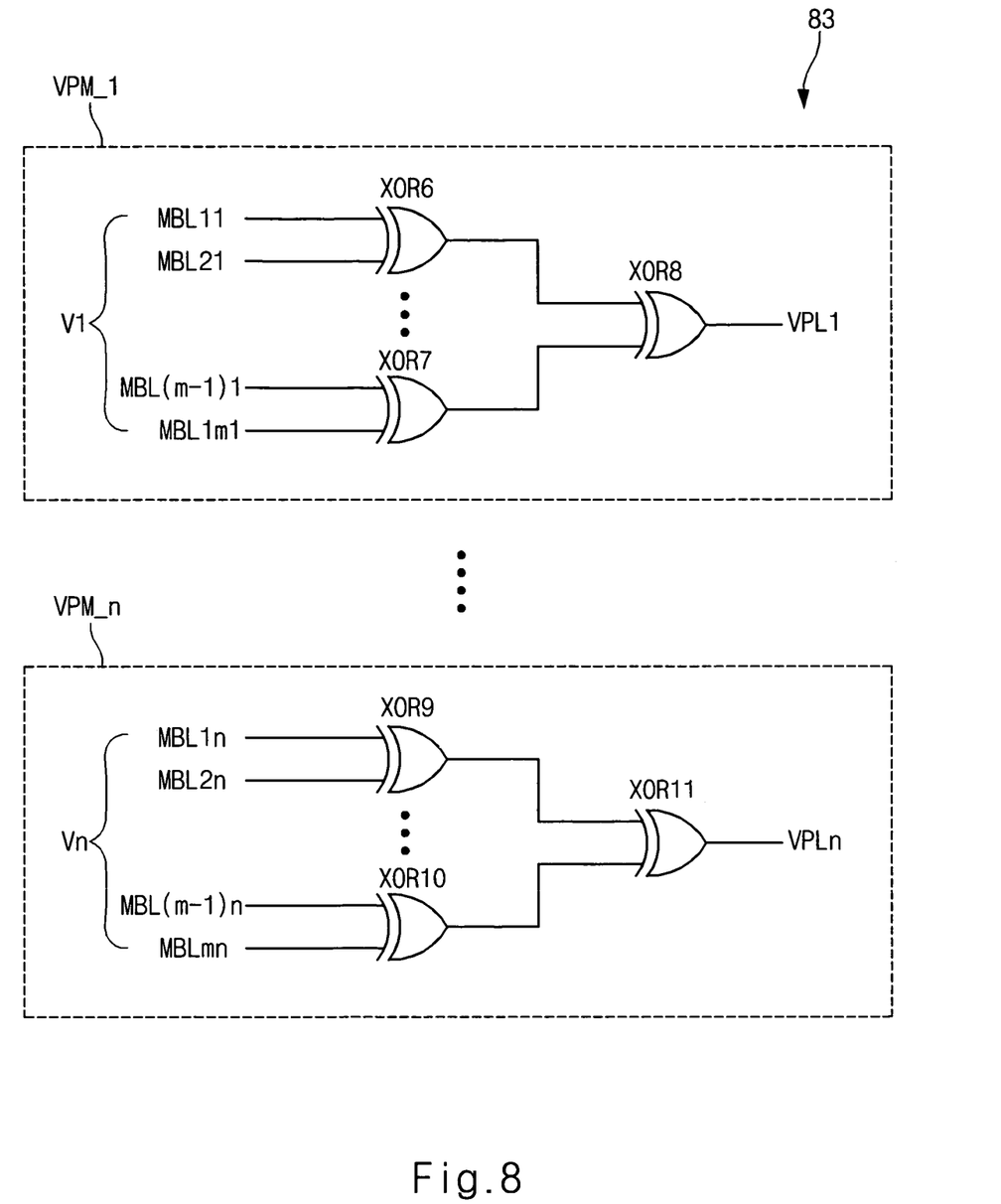
FIG. 8 is a circuit diagram illustrating a vertical parity generating unit of FIG. 6.

FIG. 8 is a circuit diagram illustrating the vertical parity generating unit 83 of FIG. 6.

The vertical parity generating unit 83 comprises n vertical parity group unit VPM_1~VPM_n. The n vertical parity group units VPM_1~VPM_n are connected one by one to a part n of the o sense amplifiers SAD1~SADo of the third sense amplifier unit 73. Each of the vertical parity group units VPM_1~VPM_n of the vertical parity generating unit 83 performs an exclusive OR operation on the n vertical parity array groups V1~Vn to output n parity generating signals to the vertical parity lines VPL1~VPLn.

The first vertical parity group unit VPM_1 comprises a plurality of exclusive OR gates XOR6~XOR8. In the same way, the nth vertical parity group unit VPM_n comprises a plurality of exclusive OR gates XOR9~XOR11.

The first vertical parity group unit VPM_1 performs an exclusive OR operation on the m vertical parity array groups V1(MBL11~MBLm1) to output the parity data of the main bit lines MBL11~MBLm1 to the vertical parity line VPL_1. The final vertical parity group unit VPM_n performs an exclusive OR operation on the vertical parity array group Vn(MBL1n~MBLmn) to output the parity data of the main bit lines MBL1n~MBLmn to the vertical parity line VPL_n.

Each of the n vertical parity group units VPM_1~VPM_n checks whether the number of "1" in the output signals from the vertical parity array group V1~Vm is odd or even. "1" is outputted to each one of the vertical parity lines VPL_1~VPL_m in which the number of "1" in the line is odd, and "0" is outputted to each one of the vertical parity lines VPL_1~VPL_m in which the number of "1" in the line is even.

Figure 9:
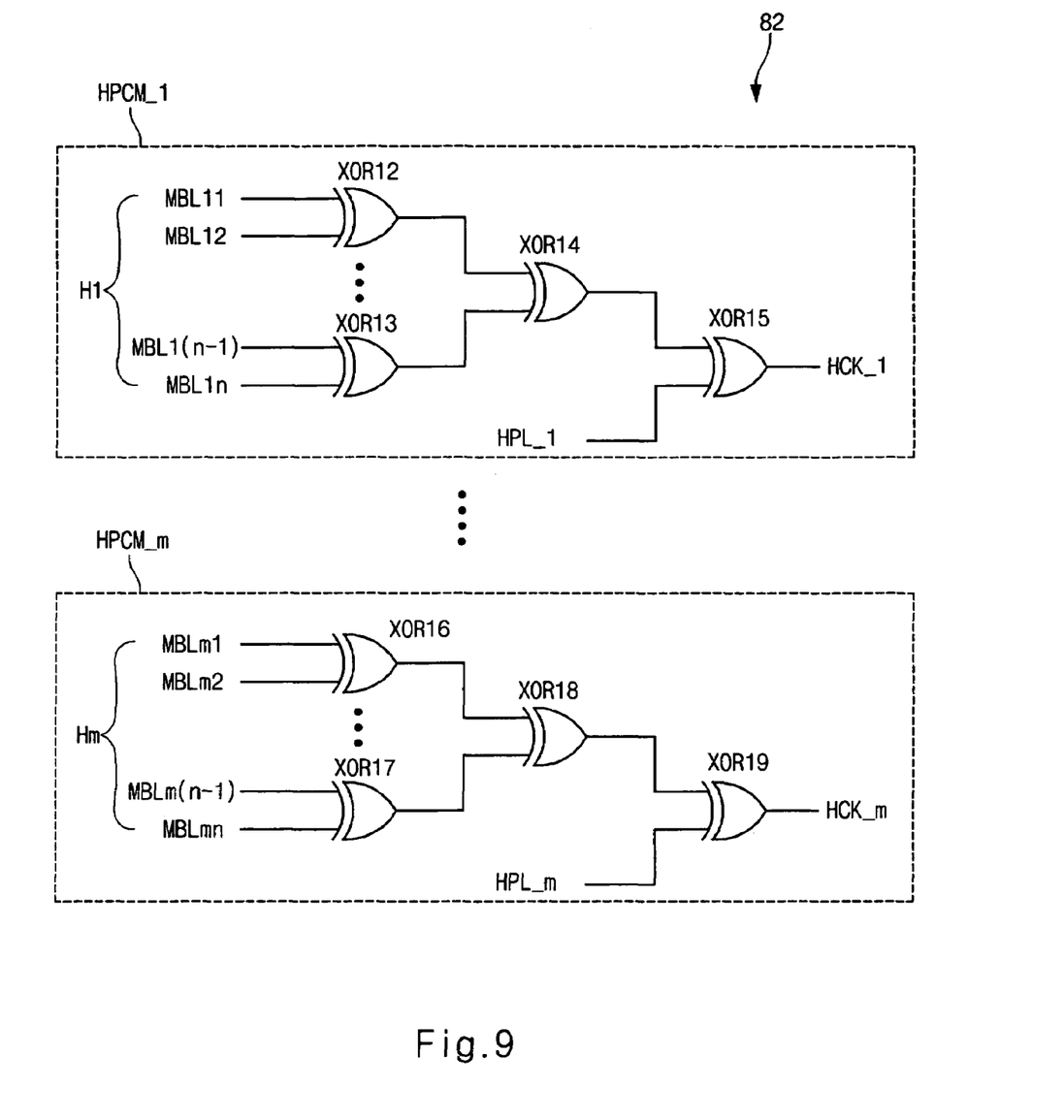
FIG. 9 is a circuit diagram illustrating a vertical parity check unit of FIG. 6.

FIG. 9 is a circuit diagram illustrating the vertical parity check unit 82 of FIG. 6.

The horizontal parity check unit 82 comprises m horizontal parity check group units HPCM_1~HPCM_m. Each of the m horizontal parity check group units HPCM_1~HPCM_m is connected one by one to a respective part m of the o sense amplifiers SAD1~SADo. Each of the horizontal parity check group units HPCM_1~HPCM_m of the horizontal parity check unit 82 performs an exclusive OR operation on the parity data on the horizontal parity array groups H1~Hn and the horizontal parity lines HPL_1~HPL_m to output m horizontal parity check signals HCK_1~HCK_m to the 1 bit error correcting unit 85.

The first horizontal parity check group unit HPCM_1 comprises a plurality of exclusive OR gates. In the same way, the mth horizontal parity check group unit HPCM_m comprises a plurality of exclusive OR gates XOR16~HOR19.

That is, each of the exclusive OR gates XOR12~XOR14 of the horizontal parity check group unit HPM_1 performs an exclusive OR operation on the n horizontal parity array group H1(MBL11~MBL1n) to output the parity check data of the main bit lines MBL11~MBL1n. The exclusive OR gate XOR15 performs an exclusive OR operation on an output signal from the exclusive OR gate XOR14 and the parity data on the horizontal parity line HPL_1 which is the first storage data of the horizontal parity check cell array 10 to output the first horizontal parity check signal HCK_1.

In the same way, each of the exclusive OR gates XOR16~XOR18 of the final horizontal parity check group unit HPM_m performs an exclusive OR operation on n horizontal parity array groups Hm(MBLm1~MBLmn) to output the parit check data of the main bit lines MBLm1~MBLmn. The exclusive OR gate XOR19 performs an exclusive OR operation on an output signal from the exclusive OR gate XOR18 and the parity data on the horizontal parity line HPL_m which is the final storage data of the horizontal parity check cell array 20 to output the final horizontal parity check signal HCK_m.

Each of the horizontal parity check group units HPCM_1~HPCM_m checks the number of "1" in output data of the horizontal parity array groups H1~Hm and data on the horizontal parity lines HPL_1~HPL_m.

The horizontal parity check signals HCK_1~HCK_m become "0" when the output data of the horizontal parity array groups H1~Hm are identical to the respective data on the horizontal parity lines HPL_1~HPL_m, while the horizontal parity check signals HCK_1~HCK_m become "1" when the output data of the horizontal parity array groups H1~Hm are not identical to the respective data on the horizontal parity lines HPL_1~HPL_m.

In other words, when the horizontal parity check signals HCK_1~HCK_m are all "0", it means that there is no error bit in cell data of the main memory cell array 30. On the other hand, when one of the horizontal parity check. signals HCK_1~HCK_m are "1", it means that there is an error bit in the cell data of the main memory cell array 30.

Figure 10:
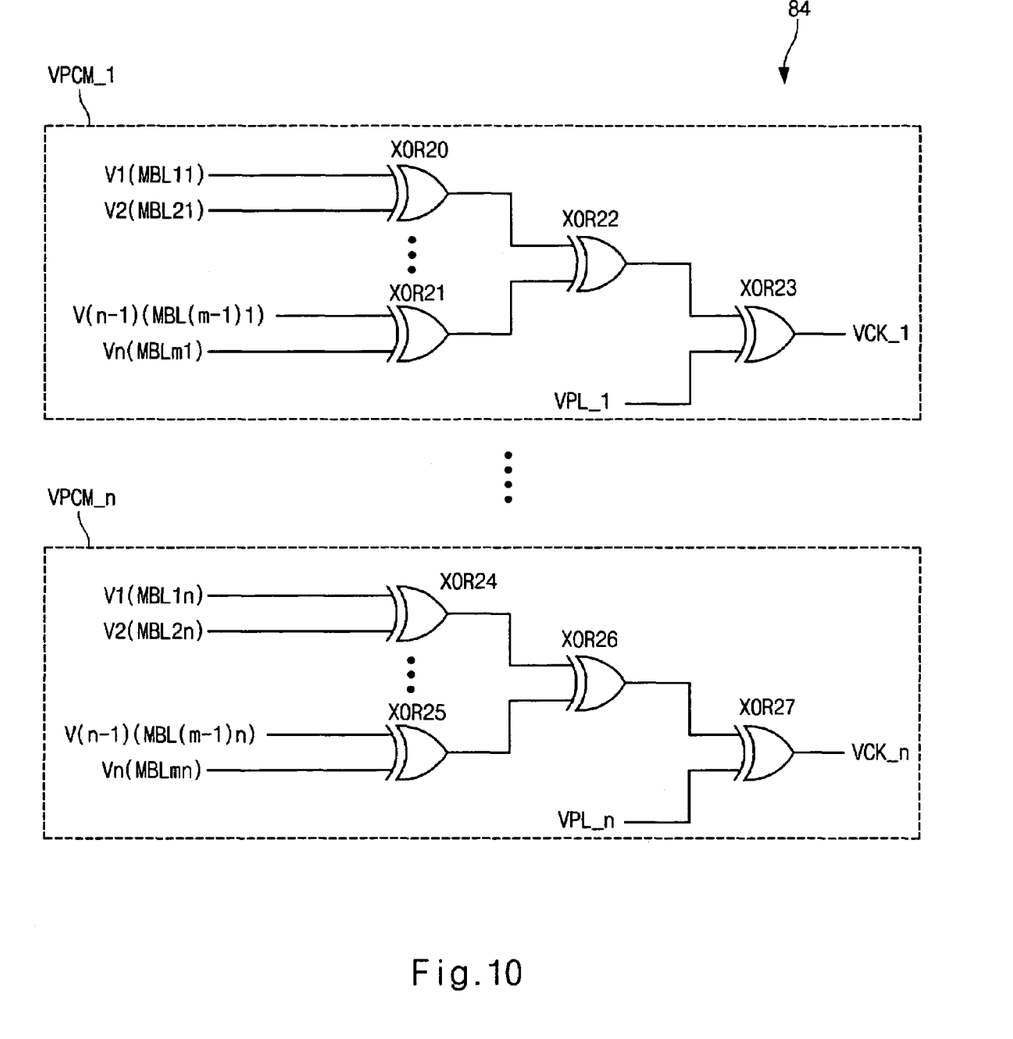
FIG. 10 is a circuit diagram illustrating a vertical parity check unit of FIG. 6.

FIG. 10 is a circuit diagram illustrating the vertical parity check unit 84 of FIG. 6.

The vertical parity check unit 84 comprises n vertical parity check group units VPCM_1~VPCM_n. The n vertical parity check group units VPCM_1~VPCM_n are connected one by one to a part n of the o sense amplifiers SAD1~SADo of the third sense amplifier unit 73. Each of the vertical parity check group units VPCM_1~VPCM_n of the vertical parity check unit 84 performs an exclusive OR operation on the parity data on the vertical parity array groups V1~Vn and the vertical parity lines VPL_1~VPL_m to output n vertical parity check signals VCK_1~VCK_m to the 1 bit error correcting unit 85.

The first vertical parity check group unit HPCM_1 comprises a plurality of exclusive OR gates XOR20~XOR23. In the same way, the mth vertical parity check group unit HPCM_m comprises a plurality of exclusive OR gates XOR24~XOR27.

Each of the exclusive OR gates XOR20~XOR22 of the first vertical parity check group unit VPM_1 performs an exclusive OR operation on the n vertical parity array group V1~Vn(MBL11~MBLm1) to output the parity check data of the main bit lines MBL11~MBLm1. The exclusive OR gate XOR23 performs an exclusive OR operation on an output signal from the exclusive OR gate XOR22 and the parity data on the vertical parity line VPL_1 which is the first storage data of the vertical parity check cell array 20 of the vertical parity check cell array 20 to output the first vertical parity check signal VCK_1.

In the same way, each of the exclusive OR gates XOR24~XOR26 of the final vertical parity check group unit VPM_n performs an exclusive OR operation on the n vertical parity array groups V1~Vn(MBL1n~MBLmn) to output the parity check data of the main bit lines MBL1n~MBLmn. The exclusive OR gate XOR27 performs an exclusive OR operation on an output signal from the exclusive OR gate XOR26 and the parity data on the vertical parity line VPL_m which is the final storage data of the vertical parity check cell array 20 to output the final vertical parity check signal VCK_n.

Each of the n vertical parity check group units VPCM_1~VPCM_n checks the number of "1" in output data of the vertical parity array groups V1~Vn and data on the vertical parity lines VPL_1~VPL_n.

Each of the vertical parity check signals VCK_1~VCK_n become "0" when the output data of the respective one of the vertical parity array groups V1~Vn are identical with the respective data on the vertical parity lines VPL_1~VPL_n. On the other hand, the vertical parity check signals VCK_1~VCK_n become "1" when the output data of the vertical parity array groups V1~Vn are different from the respective data on the vertical parity lines VPL_1~VPL_n.

In other words, when all of the vertical parity check signals VCK_1~VCK_n are "0", it means that there is no error bit in cell data of the main memory cell array 30. On the other hand, when one or more of the vertical parity check signals VCK_1~VCK_n are "1", it means that there is an error bit in the cell data of the main memory cell array 30.

Figure 11:
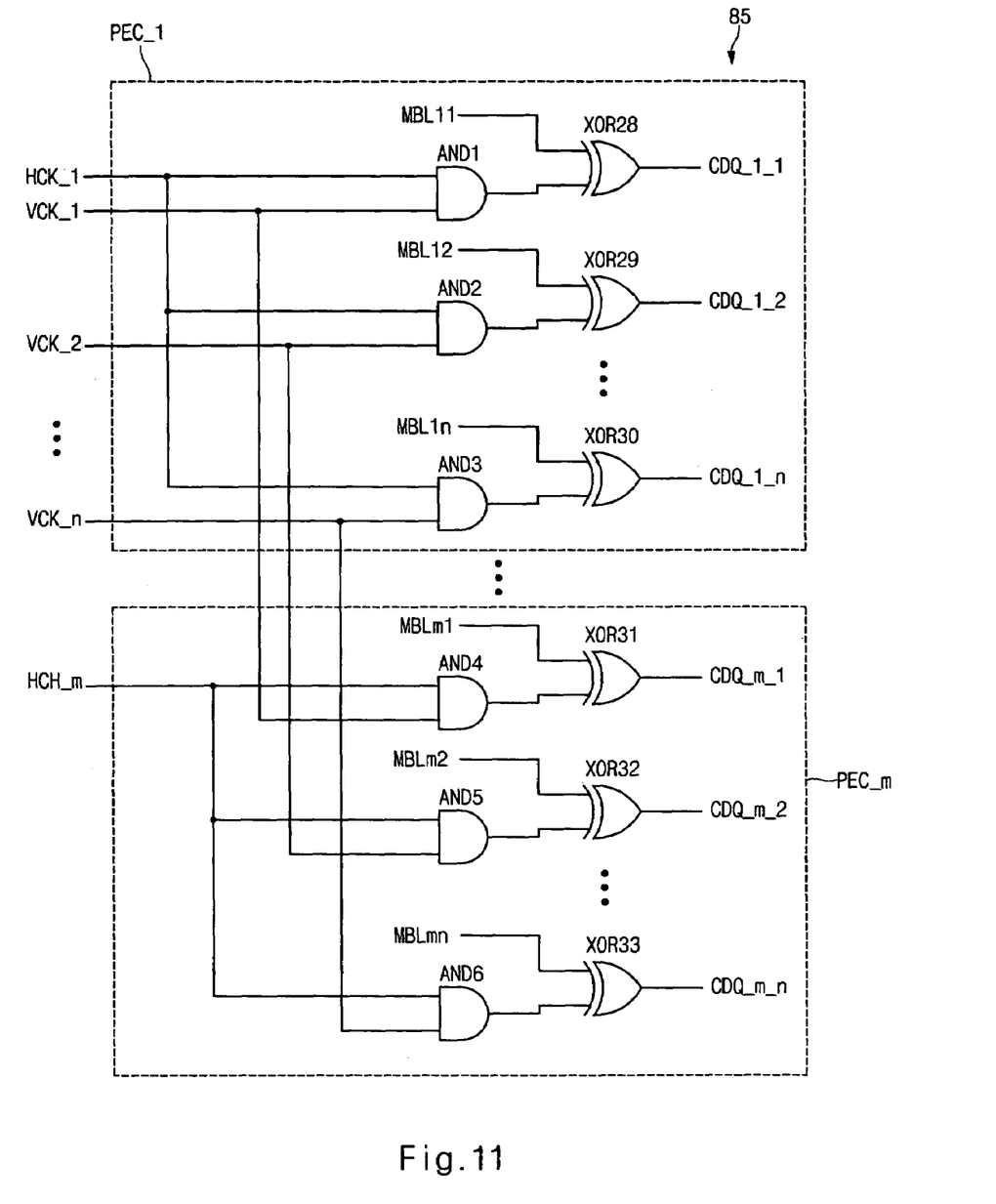
FIG. 11 is a circuit diagram illustrating a 1 bit error correcting unit of FIG. 6.

FIG. 11 is a circuit diagram illustrating the 1 bit error correcting unit 85 of FIG. 6.

The 1 bit error correcting unit 85 comprises m parity error correcting units PEC_~1~PEC_m, and is connected to the main bit lines MBL11~MBLmn of the main memory cell array 30 through o sense amplifiers SA_d1~SA_do.

Each of the m parity error correcting units PEC_1~PEC_m compares data on the respective main bit lines MBL11~MBLmn with signals obtained by performing a logic operation on the respective horizontal parity check signals HCK_1~HCK_m and the respective vertical parity check signals VCK_1~VCK_n to output o error correcting signals CDQ111~CDQmn.

The first parity error correcting unit PEC_1 comprises a plurality of AND gates AND1~AND3 and a plurality of exclusive NOR gates XOR28~XOR30. Each of the AND gates AND1~AND3 performs an AND operation on the horizontal parity check signal which is the first horizontal parity group check result and the n vertical parity check signals VCK_1~VCK_n. Each of the exclusive. NOR gates XOR28~XOR30 performs an exclusive OR operation on output signals from the plurality of AND gates AND1~AND3 and the data on the main bit lines MBL11~MBL1$n$ to output n error correcting signals CDQ11~CDQ1$n$.

In the same way, the final parity error correcting unit PEC_m comprises a plurality of AND gates AND4~AND6 and a plurality of exclusive NOR gates XOR31~XOR33. Each of the AND gates AND4~AND6 performs an AND operation on the horizontal parity check signal HCK_m which is the final horizontal parity group check result and the n vertical parity check signals VCK_1~VCK_n. Each of the exclusive NOR gates XOR31~XOR33 performs an exclusive OR operation on output signals from the AND gates AND4~AND6 and corresponding output signals from the main bit lines MBLm1~MBLmn to output n error correcting signals CDQm1~CDQmn.

As described above, a nonvolatile ferroelectric memory device according to an embodiment of the present invention checks and encodes horizontal and vertical parity of main memory cells, and then compares encoded cell arrays to correct error bits, thereby effectively processing randomly distributed cell data. Also, the nonvolatile ferroelectric memory device comprises a parity check cell array having a hierarchical bit line structure and a sense amplifier. The parity check cell array is provided in a peripheral circuit region to maximize the area and efficiency of an error correcting circuit.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile ferroelectric memory device comprising:
a main memory cell array including a plurality of nonvolatile ferroelectric memory cells configured as a plurality of main cell array groups; a horizontal parity check cell array adapted and configured to determine a parity of a horizontal portion of the plurality of main cell array groups and store the determined parity as code data in a horizontal parity memory array;
a vertical parity check cell array adapted and configured to determine a parity of a vertical portion of the plurality of main cell array groups and store the determined parity as code data in a vertical parity memory array; and
an error correcting code processing unit adapted and configured to compare data stored in the main cell array groups, the code data stored in the horizontal parity check cell array and the code data stored in the vertical parity check cell array and to correct error data generated from a corresponding column into normal data.

2. The nonvolatile ferroelectric memory device according to claim 1, wherein each of the main cell array groups, the horizontal parity check cell array and the vertical parity check cell array has a hierarchical bit line structure including a plurality of sub bit lines connected to one main bit line.

3. The nonvolatile ferroelectric memory device according to claim 1, further comprising:
a cell block switch array adapted and configured to selectively transmit data of the cell array selected from the main memory array groups, the horizontal parity check cell array and the vertical parity check cell array;
a sense amplifier array adapted and configured to sense and amplify data selectively transmitted by the cell block switch array through a data bus, and to output the data to the error correcting code processing unit;
a column switch array adapted and configured to selectively transmit data output from the error correcting code processing unit in response to a column decoding signal; and
a data buffer adapted and configured to buffer data output from the column switch array and output the data externally.

4. The nonvolatile ferroelectric memory device according to claim 3, wherein the data bus comprises:
a plurality of horizontal parity buses connected one by one to the plurality of horizontal parity check cell arrays;
a plurality of vertical parity buses connected one by one to the plurality of vertical parity check cell arrays; and
a plurality of memory data buses connected one by one to the main bit lines.

5. The nonvolatile ferroelectric memory device according to claim 4, wherein the sense amplifier array comprises:
a plurality of first sense amplifiers adapted and configured to amplify the data of the horizontal parity check cell array applied through the horizontal parity bus;
a plurality of second sense amplifiers adapted and configured to amplify the data of the vertical parity check cell array applied through the vertical parity bus; and
a plurality of third sense amplifiers adapted and configured to amplify the data of the main bit line applied through the memory data bus.

6. The nonvolatile ferroelectric memory device according to claim 1, wherein the main memory cell array groups comprise:
a row redundancy cell array adapted and configured to repair a failed cell generated from a row unit group of the main memory cell array groups, the horizontal parity check cell array and the vertical parity check cell array; and
a column redundancy cell array adapted and configured to repair a failed cell generated from a column unit group of the main memory cell array, the horizontal parity check cell array and the vertical parity check cell array.

7. The nonvolatile ferroelectric memory device according to claim 1, wherein the main cell array groups are configured as a plurality of horizontal parity array groups and a plurality of vertical parity array groups, wherein the plurality of vertical parity array groups are sequentially configured as main bit lines of the horizontal parity array groups.

8. The nonvolatile ferroelectric memory device according to claim 1, wherein the error correcting code processing unit comprises:
a horizontal parity generating unit adapted and configured to check horizontal parity in data stored in the main memory cell array groups and output a plurality of horizontal parity data to the horizontal parity check cell array;
a vertical parity generating unit adapted and configured to check vertical parity in data stored in the main memory cell array groups and output a plurality of vertical parity data to the vertical parity check cell array;
a horizontal parity check unit adapted and configured to compare data of the main memory cell array groups with check data of the horizontal parity check cell array to check horizontal parity and output a plurality of horizontal parity check signals;

a vertical parity check unit adapted and configured to compare data of the main memory cell array groups with check data of the vertical parity check cell array and output a plurality of vertical parity check signals; and a failed cell correcting circuit adapted and configured to compare the plurality of horizontal parity check signals and the plurality of vertical parity check signals with the data on the plurality of main bit lines, respectively, and output a plurality of error correcting signals.

9. The nonvolatile ferroelectric memory device according to claim 8, wherein the horizontal parity generating unit comprises a plurality of horizontal parity group units each adapted and configured to compare data on the plurality of main bit lines in each of a plurality of horizontal parity array groups to generate the plurality of horizontal parity data.

10. The nonvolatile ferroelectric memory device according to claim 8, wherein the vertical parity generating unit comprises a plurality of vertical parity group units each adapted and configured to compare data on the plurality of main bit lines in each of a plurality of vertical parity array group to generate the plurality of vertical parity data.

11. The nonvolatile ferroelectric memory device according to claim 8, wherein the horizontal parity check unit comprises a plurality of horizontal parity check group units each adapted and configured to compare an output signal of the horizontal parity check cell array with a comparison result of data on the plurality of main bit lines in each of the plurality of horizontal parity array groups to generate the plurality of horizontal parity check signals.

12. The nonvolatile ferroelectric memory device according to claim 8, wherein the vertical parity check unit comprises a plurality of vertical parity check group units each adapted and configured to compare an output signal of the vertical parity array with a comparison result of data on the plurality of main bit lines in each of the plurality of vertical parity array groups to generate the plurality of vertical parity check signals.

13. The nonvolatile ferroelectric memory device according to claim 8, wherein the error correcting unit comprises a plurality of parity error correcting units each adapted and configured to compare data on the plurality of main bit lines with signals obtained by logically combining a plurality of horizontal parity check signals and the plurality of vertical parity check signals to generate a plurality of error correcting signals.

14. The nonvolatile ferroelectric memory device according to claim 13, wherein each of the plurality of parity error correcting units comprises:

a plurality of AND gates each adapted and configured to perform an AND operation on the plurality of horizontal parity check signals and the plurality of vertical parity check signals; and a plurality of exclusive OR gates each adapted and configured to perform an exclusive OR operation on output signals of the plurality of AND gates and data on the plurality of main bit lines to output the plurality of parity error correcting signals.

* * * * *